(12) United States Patent
Majhi et al.

(10) Patent No.: US 10,424,620 B2
(45) Date of Patent: Sep. 24, 2019

(54) NON-VOLATILE MEMORY DEVICES INCLUDING INTEGRATED BALLAST RESISTOR

(71) Applicant: INTEL CORPORATION, Santa Clara, CA (US)

(72) Inventors: Prashant Majhi, San Jose, CA (US); Elijah V. Karpov, Portland, OR (US); Ravi Pillarisetty, Portland, OR (US); Uday Shah, Portland, OR (US); Niloy Mukherjee, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/777,535

(22) PCT Filed: Dec. 23, 2015

(86) PCT No.: PCT/US2015/000233
§ 371 (c)(1),
(2) Date: May 18, 2018

(87) PCT Pub. No.: WO2017/111776
PCT Pub. Date: Jun. 29, 2017

(65) Prior Publication Data
US 2018/0350880 A1 Dec. 6, 2018

(51) Int. Cl.
*H01L 27/24* (2006.01)
*H01L 45/00* (2006.01)
(Continued)

(52) U.S. Cl.
CPC ........ *H01L 27/2481* (2013.01); *G11C 11/161* (2013.01); *H01L 27/222* (2013.01);
(Continued)

(58) Field of Classification Search
CPC ............. H01L 27/2409; H01L 27/2418; H01L 27/2427; H01L 27/2481; H01L 43/02; H01L 43/08; H01L 43/10; H01L 45/1233
See application file for complete search history.

(56) References Cited

U.S. PATENT DOCUMENTS 7,499,315 B2 * 3/2009 Lowrey .............. G11C 13/0004
365/148
8,642,985 B2 * 2/2014 Chen .................... G11C 13/003
257/1
(Continued)

FOREIGN PATENT DOCUMENTS

| JP | 2015060608 A | 3/2015 |
| WO | 2017/111776 A1 | 6/2017 |

OTHER PUBLICATIONS

International Search Report and Written Opinion received for PCT Application No. PCT/US2015/000233. dated Sep. 23, 2016. 15 pages.
(Continued)

*Primary Examiner* — Allison Bernstein
(74) *Attorney, Agent, or Firm* — Finch & Maloney PLLC

(57) ABSTRACT

A non-volatile memory device is disclosed, in which a ballast resistor layer is disposed between the selector element and memory element of a given memory cell of the device. The material composition of the ballast resistor can be customized, as desired, and in some cases may be, for example, a sub-stoichiometric oxide of hafnium oxide ($HfO_x$), tantalum oxide ($TaO_x$), or titanium dioxide ($TiO_x$), or an alloy of any thereof. In accordance with some embodiments, the integrated ballast resistor may serve the function of damping current surge related to the snapback characteristics of the selector element, preserving control of memory element switching. In accordance with some embodiments, an integrated ballast resistor layer provided as described
(Continued)

herein may be implemented, for example, in any of a wide range of resistive random-access memory (RRAM) architectures and spin-transfer torque magnetic random-access memory (STTMRAM) architectures, including cross-point implementations of these types of architectures.

20 Claims, 5 Drawing Sheets

(51) Int. Cl.
    *G11C 11/16*     (2006.01)
    *H01L 27/22*     (2006.01)
    *H01L 43/02*     (2006.01)
    *H01L 43/10*     (2006.01)
    *G11C 13/00*     (2006.01)

(52) U.S. Cl.
    CPC .............. *H01L 43/02* (2013.01); *H01L 43/10* (2013.01); *H01L 45/08* (2013.01); *H01L 45/141* (2013.01); *H01L 45/146* (2013.01); *G11C 11/165* (2013.01); *G11C 13/0021* (2013.01); *G11C 2213/32* (2013.01); *G11C 2213/71* (2013.01)

(56) References Cited

U.S. PATENT DOCUMENTS

| | | | |
|---|---|---|---|
| 8,735,217 B2 * | 5/2014 | Pham | H01L 45/1608 |
| | | | 257/2 |
| 8,969,844 B1 * | 3/2015 | Wang | H01L 45/08 |
| | | | 257/2 |
| 2006/0158928 A1 | 7/2006 | Pellizzer et al. | |
| 2010/0163825 A1 * | 7/2010 | Dennison | H01L 27/2427 |
| | | | 257/3 |
| 2014/0246643 A1 | 9/2014 | Kim et al. | |
| 2015/0129827 A1 | 5/2015 | Chen et al. | |
| 2015/0263069 A1 | 9/2015 | Jo | |

OTHER PUBLICATIONS

International Preliminary Report on Patentability received for PCT Application No. PCT/US2015/000233. dated Jun. 26, 2018. 11 pages.
Crossbar—RRAM Overview—"A Completely New Storage Class Memory," Retrieved from the internet at http://www.crossbar-inc.com. on Dec. 3, 2015. 4 pages.
"Memory technologies Today = Tradeoffs", Intel Corporation. 2015. 1 page.
Jo, et al., "Cross-Point Resistive RAM Based on Field-Assisted Superlinear Threshold Selector," IEEE Transactions on Electron Devices, vol. 62, No. 11, Nov. 2015. pp. 3477-3481.
"Breakthrough Nonvolatile Memory Technology," Micron Technology, Inc. -3D XPoint Technology. Retrieved from the internet at https://www.micron.com/about/innovations/3d-xpoint-technology, on Dec. 3, 2015. 2 pages.
"3D XPoint," Wikipedia_3DXPoint, Retrieved from the internet on Dec. 3, 2015. 3 pages.

* cited by examiner

Selector without Snapback

Selector with Snapback

NON-VOLATILE MEMORY DEVICES INCLUDING INTEGRATED BALLAST RESISTOR

BACKGROUND

A typical resistive random-access memory (RRAM) cell includes a switching material disposed between two electrodes. Ions in the switching material migrate in response to an appropriate bias provided across the electrodes. This ion movement produces a measurable change in device resistance, effectively causing the switching material to transition from an insulator to a conductor. As such, the switching material can be electrically switched between high and low resistivity states, allowing for programming of the RRAM cell, wherein the low resistivity state represents a binary '0', and the high resistivity state represents a binary '1', for example.

Figure 1:
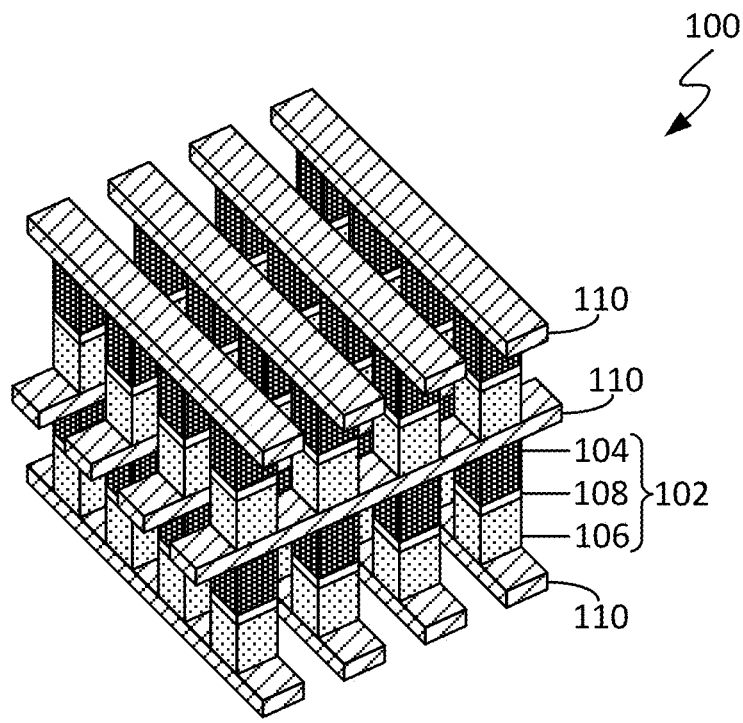
FIG. 1 illustrates a perspective view of a non-volatile memory device configured in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

A non-volatile memory device is disclosed, in which a ballast resistor layer is disposed between the selector element and memory element of a given memory cell of the device. The material composition of the ballast resistor can be customized, as desired for a given target application or end-use, and in some cases may be, for example, a sub-stoichiometric oxide of hafnium oxide (HfO$_x$), tantalum oxide (TaO$_x$), or titanium oxide (TiO$_x$), or an alloy of any thereof. In accordance with some embodiments, the integrated ballast resistor may serve the function of damping current surge related to the snapback characteristics of the selector element, thereby preserving control of memory element switching. In accordance with some embodiments, an integrated ballast resistor layer provided as described herein may be implemented, for example, in any of a wide range of resistive random-access memory (RRAM) architectures and spin-transfer torque magnetic random-access memory (STTMRAM) architectures, including cross-point implementations of these types of architectures. Numerous configurations and variations will be apparent in light of this disclosure.

General Overview

In a cross-point resistive random-access memory (RRAM) architecture, each memory cell includes a resistive memory element and a selector element operatively coupled therewith. Selector elements generally considered suitable for low-voltage embedded non-volatile memory (eNVM) applications exhibit threshold switching characteristics (e.g., so-called snapback characteristics). As such, an attempt at integration of these types of selector elements into existing architectures would result in parasitic current discharge through the resistive memory elements, causing uncontrolled switching characteristics. Instead, existing cross-point memory architectures either: (1) integrate a snapback selector with RRAM materials that are not impacted by high current surge but which operate at high voltage; or (2) employ a snapless selector with RRAM that operates at high voltage.

Thus, and in accordance with some embodiments of the present disclosure, a non-volatile memory device is disclosed, in which a ballast resistor layer is disposed between the selector element and memory element of a given memory cell of the device. The material composition of the ballast resistor can be customized, as desired for a given target application or end-use, and in some cases may be, for example, a sub-stoichiometric oxide of hafnium oxide (HfO$_x$), tantalum oxide (TaO$_x$), or titanium oxide (TiO$_x$), or an alloy of any thereof. In accordance with some embodiments, the integrated ballast resistor may serve the function of damping current surge related to the snapback characteristics of the selector element, thereby preserving control of memory element switching.

In accordance with some embodiments, an integrated ballast resistor layer provided as described herein may be implemented, for example, in any of a wide range of resistive random-access memory (RRAM) architectures and spin-transfer torque magnetic random-access memory (STT-MRAM) architectures, including cross-point implementations of these types of architectures. In accordance with an embodiment, a cross-point memory architecture including one or more integrated ballast resistors configured as described herein may be utilized, for example, in realizing high-density RRAM for embedded non-volatile memory (eNVM). In an example case, a 1S-1R-1r cross-point memory cell for eNVM may be realized. Numerous other suitable uses and variations will be apparent in light of this disclosure.

In some cases, inclusion of an integrated ballast resistor configured as described herein may prevent (or otherwise reduce) current spikes from a selector with snapback characteristics, which may improve control of memory cell variability, in accordance with some embodiments. In some instances, inclusion of an integrated ballast resistor configured as described herein may help to maintain a low total voltage for an associated memory cell. In some cases, inclusion of an integrated ballast resistor layer configured as described herein may facilitate provision of oxygen for an associated memory cell (e.g., RRAM cell). In accordance with some embodiments, use of the disclosed techniques may be detected, for example, by any one, or combination, of scanning electron microscopy (SEM), transmission electron microscopy (TEM), or other suitable inspection of a given memory device or other integrated circuit structure having a ballast resistor layer configured as variously described herein.

Structure and Operation

Figure 2:
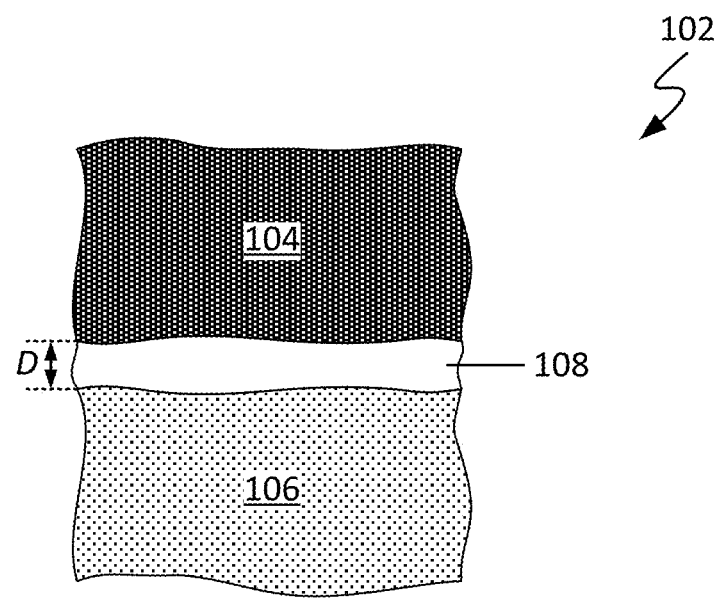
FIG. 2 illustrates a side cross-sectional view of a non-volatile memory cell configured in accordance with an embodiment of the present disclosure.

FIG. 1 illustrates a perspective view of a memory device 100 configured in accordance with an embodiment of the present disclosure. As can be seen, memory device 100 includes a plurality of memory cells 102. FIG. 2 illustrates a side cross-sectional view of a memory cell 102 configured in accordance with an embodiment of the present disclosure. In accordance with some embodiments, a given memory cell 102 may include, for example, a memory element 104, a selector element 106, and a ballast resistor layer 108 disposed there between, each of which is discussed below. In a more general sense, a given memory cell 102 may be configured as a sub-microscopic column (e.g., a stack) of these, and possibly additional or different, layers and elements. Also, although graphically omitted from FIG. 1 for clarity, memory device 100 further may include one or more dielectric layers that isolate the individual memory cells 102 from one another, in accordance with some embodiments. The material composition of such a dielectric layer can be customized, as desired for a given target application or end-use.

Memory cells 102 may be formed, for example, in a regular, semi-regular, or irregular array, as desired for a given target application or end-use. That is, in some instances, memory cells 102 may be formed as a regular array in which all (or nearly all) of the memory cells 102 are arranged in a systematic manner in relation to one another. In other instances, memory cells 102 may be formed as a semi-regular array in which a sub-set of the memory cells 102 are arranged in a systematic manner in relation to one another, but at least one other memory cells 102 is not so arranged. In still other instances, memory cells 102 may be formed as an irregular array in which the memory cells 102 are not arranged in a systematic manner in relation to one another. In some cases, neighboring memory cells 102 may be substantially equidistantly spaced from one another (e.g., may exhibit a substantially constant spacing). In some other cases, however, the spacing of neighboring memory cells 102 may be varied, as desired.

A given memory element 104 may have any of a wide range of configurations. For instance, in some embodiments, a given memory element 104 may include a resistive random-access memory (RRAM) element. Some examples include oxide-based RRAM, metal-based RRAM (metal-RRAM), and spin-transfer torque magnetic random-access memory (STTMRAM) elements, to name a few. In some cases, memory element 104 may include an oxide of hafnium (Hf), tantalum (Ta), aluminum (Al), titanium (Ti), tungsten (W), nickel (Ni), or silicon (Si), or a sub-oxide or alloy of any one or more thereof. A given memory element 104 can be formed via any suitable standard, custom, or proprietary deposition and etch technique(s) or other subtractive flow process(es), as will be apparent in light of this disclosure. Also, the geometry and dimensions of a given memory element 104 can be customized, as desired for a given target application or end-use. Other suitable materials, formation techniques, and configurations for memory elements 104 will depend on a given application and will be apparent in light of this disclosure.

In accordance with some embodiments, selector element 106 may be configured, for example, as a threshold selector or any other suitable selector, as desired for a given target application or end-use. The material composition of a given selector element 106 may be customized, as desired for a given target application or end-use. In some embodiments, a given selector element 106 may be formed from a tellurium (Te)-rich (or otherwise Te-based) compound, such as germanium telluride ($GeTe_6$) or silicon telluride ($SiTe_6$). In some other embodiments, a given selector element 106 may be formed from a selenium (Se)-rich (or otherwise Se-based) compound, such as germanium selenide ($Ge_3Se_2$). In some other embodiments, a given selector element 106 may be formed from a copper (Cu)-rich (or otherwise Cu-based) compound, such as copper germanium selenide ($Cu_8GeSe_6$), copper indium selenide ($CuInSe_2$), copper indium telluride ($CuInTe_2$), or copper indium sulfide ($CuInS_2$). In a more general sense, and in accordance with some embodiments, a given selector element 106 can be formed from any one, or combination, of the aforementioned materials. A given selector element 106 can be formed via any suitable standard, custom, or proprietary deposition and etch technique(s) or other subtractive flow process(es), as will be apparent in light of this disclosure. Also, the geometry and dimensions of a given selector element 106 can be customized, as desired for a given target application or end-use. Other suitable materials, formation techniques, and configurations for selector elements 106 will depend on a given application and will be apparent in light of this disclosure.

Figure 3:
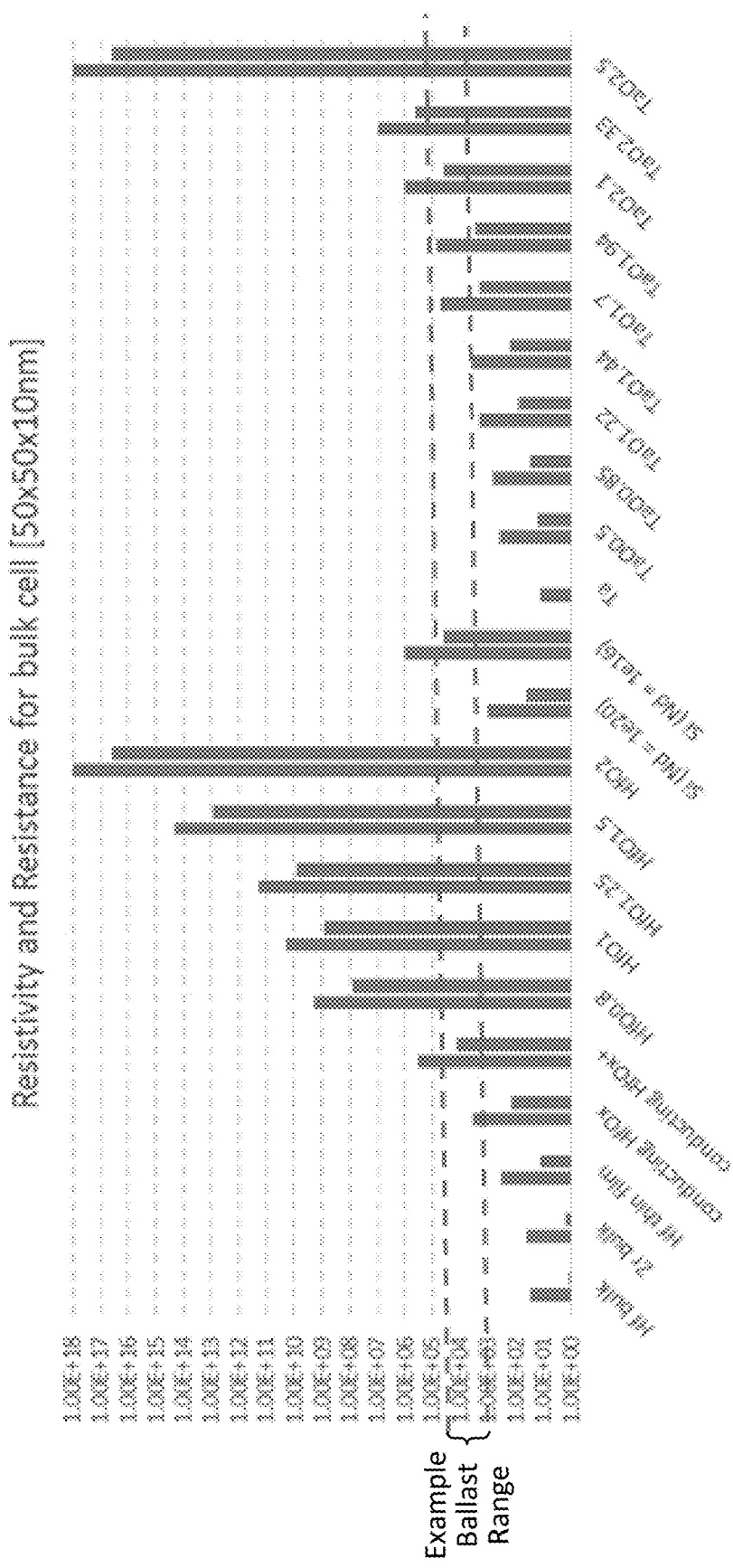
FIG. 3 is a graph illustrating resistivity and resistance ranges for several example materials that can be utilized as a ballast resistor layer, in accordance with some embodiments of the present disclosure.

In accordance with some embodiments, a ballast resistor layer 108 may be disposed between the memory element 104 and the selector element 106 of a given memory cell 102. The material composition of ballast resistor layer 108 may be customized, as desired for a given target application or end-use. In some cases, ballast resistor layer 108 may be formed from one or more sub-stoichiometric oxides, for example, of tantalum oxide ($TaO_x$), hafnium oxide ($HfO_x$), or titanium oxide ($TiO_x$), or an alloy of any thereof, among others. In some cases, ballast resistor layer 108 may comprise $TaO_x$, with x in the range of about 1.2-2.1 (e.g., about 1.2-1.65, about 1.65-2.1, or any other sub-range in the range of about 1.2-2.1). In some such cases, x may be in the range of about 1.44-1.94. In some cases, ballast resistor layer 108 may comprise $HfO_x$, with x in the range of about 0.3-0.8 (e.g., about 0.3-0.55, about 0.55-0.8, or any other sub-range in the range of about 0.3-0.8). In a more general sense, and in accordance with an embodiment, the material composition of ballast resistor layer 108 may be tuned to achieve a given desired resistivity range. FIG. 3 is a graph illustrating resistivity and resistance ranges for several example materials that can be utilized as ballast resistor layer 108, in accordance with some embodiments of the present disclosure. Although the dashed lines shown in FIG. 3 denote the typical ballast range for the listed materials, as will be appreciated in light of this disclosure, ballast range may depend, at least in part, on operating current.

In accordance with some embodiments, ballast resistor layer 108 can be formed via any one, or combination, of a chemical vapor deposition (CVD) process, an atomic layer deposition (ALD) process, or any other suitable standard, custom, or proprietary technique(s), as will be apparent in light of this disclosure. Also, the geometry and dimensions of ballast resistor layer 108 can be customized, as desired for a given target application or end-use. In some cases, ballast resistor layer 108 may have a thickness (D), for example, in the range of about 1-50 nm (e.g., about 1-25 nm, about 25-50 nm, or any other sub-range in the range of about 1-50 nm). In some instances, ballast resistor layer 108 may have a substantially uniform thickness over the topography provided, for example, by an adjacent memory element 104 or selector element 106 (or both). In some instances, ballast resistor layer 108 may be provided as a substantially conformal layer over such topography. In other instances, ballast resistor layer 108 may be provided with a non-uniform or otherwise varying thickness over such topography. For example, in some cases, a first portion of ballast resistor layer 108 may have a thickness within a first range, whereas a second portion thereof may have a thickness within a second, different range. In some instances, ballast resistor layer 108 may have first and second portions, for example, having average thicknesses that are different from one another by about 20% or less, about 15% or less, about 10% or less, or about 5% or less. Other suitable materials, formation techniques, and configurations for ballast resistor layer 108 will depend on a given application and will be apparent in light of this disclosure.

As can be seen further from FIG. 1, memory cells 102 may be disposed between electrode layers 110. The illustrated example memory device 100 of FIG. 1 includes three electrode layers 110, though the present disclosure is not intended to be so limited, as in other cases, and in accordance with other embodiments, lesser (e.g., two or fewer) or greater (e.g., four or more) quantities of electrode layers 110 may be provided, as desired for a given target application or end-use. A given electrode layer 110 may include one or more electrically conductive wires. For any two adjacent wires of a given electrode layer 110, those wires may be arranged substantially parallel to one another (e.g., within about 5° of parallel alignment), in accordance with some embodiments. For any two adjacent electrode layers 110 (e.g., one electrode layer 110 subjacent or superjacent another electrode layer 110), their respective constituent wires may be arranged substantially orthogonal to one another (e.g., within about 5° of orthogonal/perpendicular alignment), in accordance with some embodiments. In accordance with some other embodiments, however, any two adjacent electrode layers 110 may be offset from one another at lesser or greater angles (e.g., in about a 45° diagonal or other transverse or otherwise non-orthogonal alignment). In a more general sense, as between any two wires of memory device 100, whether in the same or different electrode layers 110, the amount of parallelism and orthogonality can be exact or otherwise within a given tolerance, as desired for a given target application or end-use. Numerous configurations and variations will be apparent in light of this disclosure.

A given wire of a given electrode layer 110 can be formed from any one, or combination, of suitable electrically conductive materials, such as, for example, copper (Cu), aluminum (Al), tungsten (W), nickel (Ni), cobalt (Co), silver (Ag), gold (Au), titanium (Ti), and tantalum (Ta), among others. A given electrode layer 110 can be formed via any one, or combination, of an electroplating process, an electroless deposition process, an atomic layer deposition (ALD) process, or any other suitable standard, custom, or proprietary technique(s), as will be apparent in light of this disclosure. Also, the geometry and dimensions of a given wire of a given electrode layer 110 can be customized, as desired for a given target application or end-use. Other suitable materials, formation techniques, and configurations for electrode layer(s) 110 will depend on a given application and will be apparent in light of this disclosure.

In accordance with some embodiments, memory device 100 may be configured as a three-dimensional cross-point memory device, in which a given memory cell 102 sits at the intersection of a wire of each of an upper and lower electrode layer 110. In some cases, memory device 100 may be configured as a non-volatile memory (NVM) device. In accordance with some embodiments, a given memory cell 102 may be configured to store data (e.g., a single bit of data) and can be individually addressed and written or read, for example, by selecting its corresponding anode and cathode from electrode layers 110 of memory device 100 and varying the voltage across associated selector element 106. In an example case, one wire of a first electrode layer 110 may serve as the bit line, and another wire of a second electrode layer 110 may serve as the word line for a given memory cell 102. As will be appreciated in light of this disclosure, and in accordance with an embodiment, the voltage difference applied across a given selector element 106 may allow a corresponding memory element 104 to be written to or read without requiring a transistor. In accordance with some embodiments, the ballast resistor layer 108 between a given memory element 104 and selector element 106 may serve to control current surges for its associated memory cell 102. To that end, ballast resistor layer 108 may serve the function of damping current surge related to the snapback characteristic of an associated selector element 106 and thus preserve the control of memory element 104 switching.

As will be further appreciated in light of this disclosure, memory cells 102 and electrode layers 110 may be stacked (or otherwise expanded) in any direction to make any desired memory architecture. In stacking memory cells 102 and attendant electrode layers 110 to form a cross-point memory array, memory density for the host memory device 100 may be boosted. Numerous configurations and variations will be apparent in light of this disclosure.

Example Memory Circuit

Figure 4:
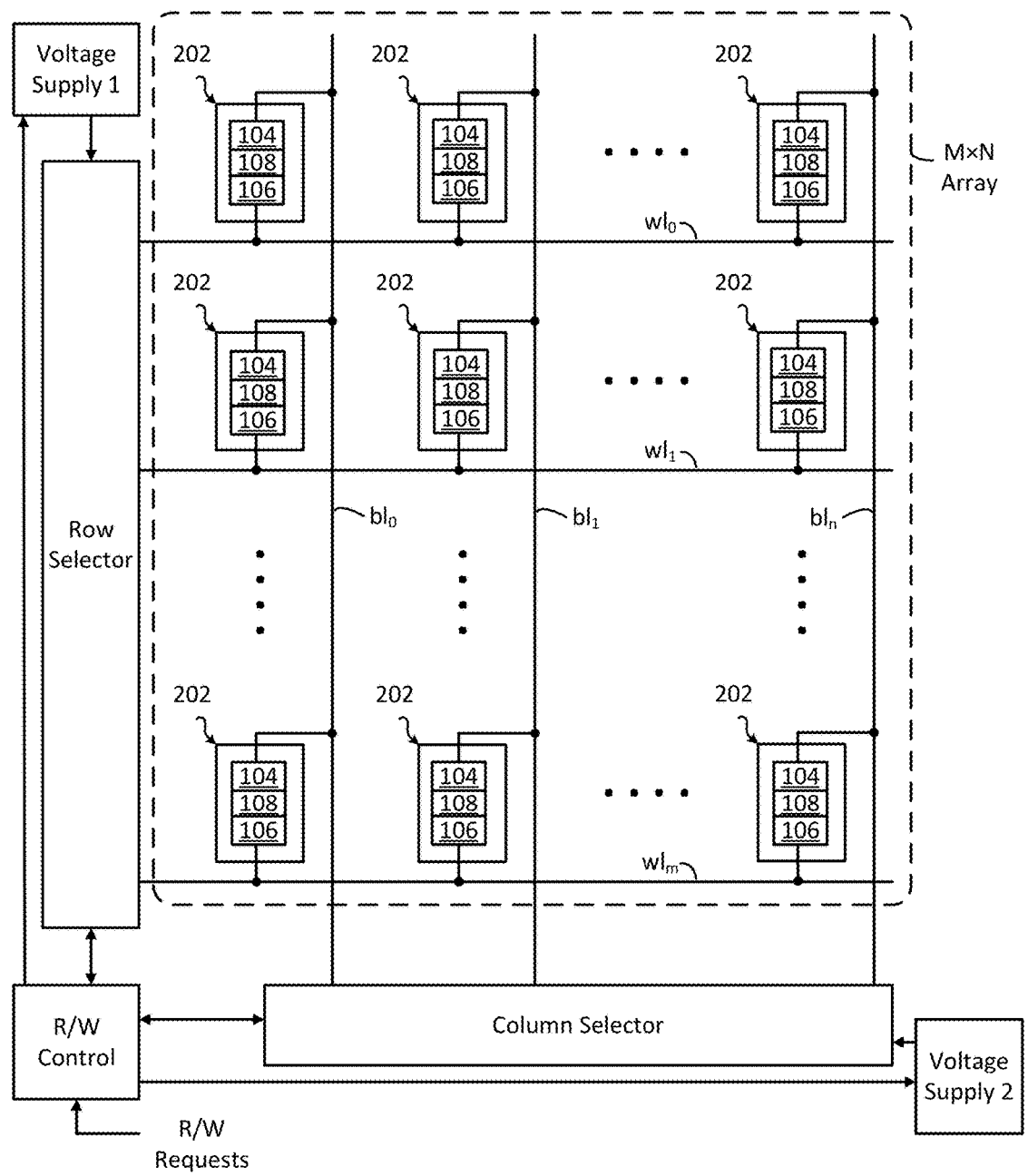
FIG. 4 illustrates an example embedded bi-directional memory circuit configured in accordance with an embodiment of the present disclosure.

FIG. 4 illustrates an example embedded bi-directional memory circuit configured in accordance with an embodiment of the present disclosure. As can be seen, the memory circuit of this example embodiment includes column select circuitry, row select circuitry, read/write (R/W) control circuitry, voltage supply circuitry (Voltage Supply 1 and 2), and an M×N array of memory cells 202 (M and N can be any integer values, as will be appreciated). Each memory cell 202 includes a bi-directional memory element 104 and a selector 106 connected in series via a ballast resistor 108. The depicted example array is configured as a bi-directional cross-point array. The actual array size will depend on the given application. Specific examples include a 32-row by 32-column organization, a 64-row by 64-column organization, a 128-row by 128-column organization, or a 32-row by 128-column organization. Further, note that the number of rows M need not match the number of columns N. As can be seen further, each column is associated with its own bit line (bl0, bl1, . . . , bln), and each bit line is driven by a corresponding column select circuit included in the column select circuitry. In addition, each row is associated with its own word line (wl0, wl1, . . . , wlm), and each word line is driven by a corresponding row select circuit included in the row select circuitry. Numerous other configurations will be apparent, and the present disclosure is not intended to be limited to the particular example configuration shown here.

In operation, the R/W control circuitry receives memory access requests (e.g., from a local processor or communication chip in which the memory is embedded), generates the requisite control signals based on that request (e.g., read, write 0, or write 1), and applies those control signals to the row and column selector circuitry. In addition, the voltage supplies 1 and 2 are switched or otherwise commanded (e.g., by the R/W control, the respective selector circuitries, or both) to provide the voltage necessary to bias the array so as to facilitate the requested action. The row and column selector circuitry then applies the appropriate voltages from voltage supplies 1 and 2 across the array so that only the selected memory cell(s) 202 are accessed. As will be appreciated in light of this disclosure, each of the voltage supply 1, voltage supply 2, row selector circuitry, column select circuitry, and R/W control can be implemented with standard, custom, or proprietary technology as desired, and the present disclosure is not intended to be limited to any particular configurations thereof. Rather, any suitable configurations can be used in an embodiment of the present disclosure, where the memory cells 202 are configured with an intervening ballast resistor 108.

As will be appreciated, the example memory of FIG. 4 is bi-directional in nature, in that the current flow through a given memory cell 202 will depend on the voltage values applied by supplies 1 and 2. In general, the current will flow from the greater supply to the lesser supply. For example, and in accordance with one example embodiment, if voltage supply 1 is 0.9 volts and voltage supply 2 is 0.0 volts, then current will flow from supply 1 through the corresponding row selector circuitry and corresponding memory cell 202 and through the corresponding column selector circuitry to voltage supply 2, assuming that the selector 106 of the corresponding memory cell 202 is turned on (e.g., threshold $V_{TH}$ exceeded) so as to allow current to flow therethrough. The opposite current direction would apply if voltage supply 2 was 0.9 volts and voltage supply 1 was 0.0 volts. As will be further appreciated, the voltage supplies 1 and 2 can be configured to provide positive and negative voltage or current (or both) to the selected memory cells 202 within the array and may include components that are directed toward specific memory operations. For example, a voltage supply may include specific current sources, set at different levels, for reading from and writing to a given memory cell 202. As previously noted, the row and column selector circuits operate to select among the different polarities of voltage supply provided by the respective voltage supplies 1 and 2, which in this example embodiment are controlled by the R/W control circuitry. In still other embodiments, note that the memory may be unidirectional, in that bi-directionality is not required.

Selector with Snapback

Figure 5A:
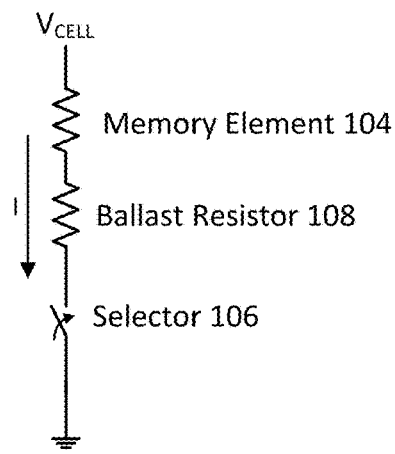
FIG. 5A schematically illustrates an example bi-directional memory cell configured in accordance with an embodiment of the present disclosure.

FIG. 5A schematically illustrates an example memory cell configured in accordance with an embodiment of the present disclosure. As can be seen, the memory cell (or bitcell) is implemented with a resistive memory element 104, a ballast resistor 108, and a selector 106 configured with snapback. The maximum voltage drop across the cell in this example is $V_{CELL}$ (i.e., $V_{CELL}$–0.0 volts=$V_{CELL}$), so as to provide a current flow (I) in the direction shown.

Figure 5B:
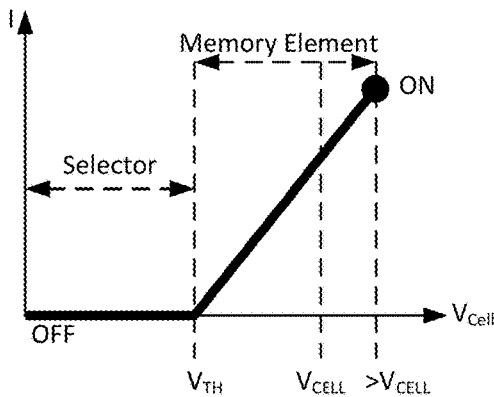
FIG. 5B illustrates an example selector performance without snapback.
Figure 5C:
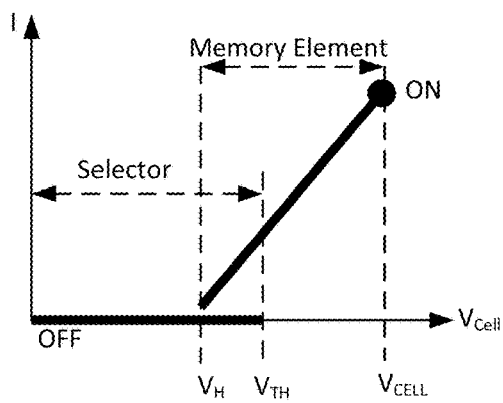
FIGS. 5C-5D illustrate an example selector performance with snapback.

FIG. 5B illustrates selector performance without snapback, and FIG. 5C illustrates an example selector performance with snapback. This particular example of FIG. 5C shows how a write can be accommodated with a selector 106 that features snapback. As can be seen in FIG. 5B, once the voltage across a memory cell exceeds the threshold $V_{TH}$, the selector without snapback transitions the memory cell from an OFF-state to an ON-state. However, note that the I-V curve associated with the selector indicates that the selector and memory write voltage cannot be accommodated at the given voltage supply $V_{CELL}$ (because the 'ON' voltage of the selector exceeds $V_{CELL}$).

Figure 5D:
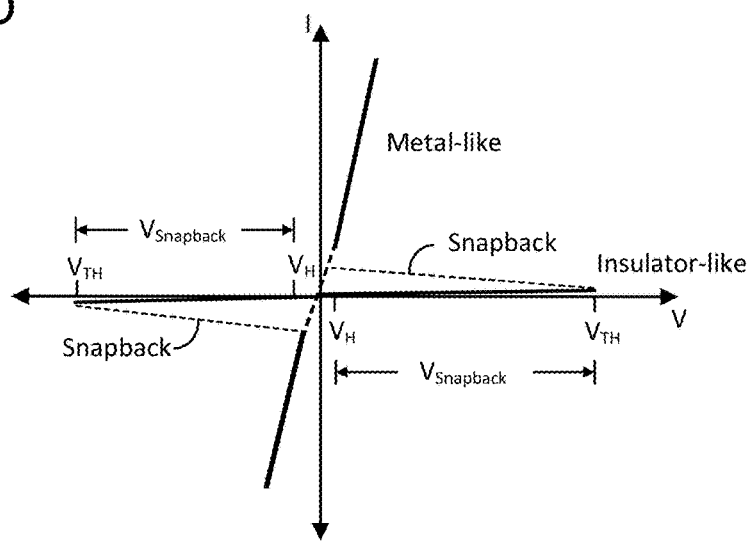

In contrast and with reference to FIG. 5C, once the voltage across a memory cell exceeds the threshold $V_{TH}$, the selector 106 with snapback transitions the memory cell from an OFF-state to an ON-state by changing from an insulator-like material to a conductor-like material, and consequently snaps back to a hold voltage $V_H$, thereby accommodating the same memory under the same $V_{CELL}$ requirement. In this sense, the selector 106 supports an S-shaped I-V characteristic, as generally shown in FIG. 5D. The selector 106 is configured such that it turns off once the voltage across the memory cell falls below the hold voltage $V_H$ (or hold current, $I_H$). The snapback voltage $V_{Snapback}$ equals the threshold voltage $V_{TH}$ minus the hold voltage $V_H$. Otherwise put, the snapback voltage $V_{Snapback}$ is the voltage drop across the selector 106 in the ON-state. The snapback of the selector 106 is exploited to accommodate the ON-state voltage of the selector 106 under the given maximum supply voltage $V_{CELL}$, wherein without the snapback, the ON-state voltage would exceed that maximum supply voltage. In some example embodiments, the maximum supply voltage $V_{CELL}$ can be less than 1 volt (e.g., 0.9 volts or less).

Thus, a selector 106 configured according to some embodiments not only turns ON when $V_{TH}$ is exceeded and OFF when $V_H$ is no longer satisfied, but also can provide a snapback response. In accordance with some embodiments, a selector 106 generally includes a dielectric material sandwiched between two electrode materials. The electrodes can be implemented with any number of suitable materials, such as, for example, carbon (C), gold (Au), nickel (Ni), platinum (Pt), silver (Ag), molybdenum (Mo), molybdenum nitride ($MoN_2$), molybdenum carbide (MoC), titanium (Ti), titanium nitride (TiN), titanium carbide (TiC), tungsten (W), tungsten carbide (WC), tungsten nitride ($WN_2$), and mixtures of any thereof, as well as conductive metal oxides.

In accordance with some embodiments, example materials that enable a selector 106 with an S-shaped I-V characteristic or that otherwise exhibit a snapback condition generally include, but are not limited to, multi-component oxide and alloy systems that contain metals from periods 4, 5, or 6 of the periodic table, and generally have partially filled valence d-shells. Ideally, such materials behave as an insulator (e.g., with only negligible leakage currents) in the OFF-state when biased below $V_{TH}$, but act as a metal (e.g., which conducts high currents) at relatively low biases when switched to the ON-state. The transition is reversible: when the bias is removed or otherwise no longer satisfied, the material returns to its original insulating state. In some specific example embodiments, the selector 106 dielectric is implemented with vanadium oxide ($VO_2$), manganese oxide (MnO), or titanium oxide ($Ti_2O_3$). Other so-called Mott insulators having S-shaped I-V curves with snapback may be used as well for the selector dielectric, such as iron oxide ($Fe_2O_3$), niobium dioxide ($NbO_2$), and tantalum oxide ($TaO_2$). In some embodiments, a mixture of any of such oxides can be used. In other embodiments, the dielectric of the selector 106 can be implemented with oxides referred to as Perovskites, having the chemical formula $R_{(1-x)}A_xBO_3$, where R is a rare-earth atom, A is a bi-valent atom, and B may be selected from manganese (Mn), nickel (Ni), cobalt (Co), titanium (Ti), or vanadium (V). In some embodiments, a mixture of any of such Perovskites can be used. In still other embodiments, the dielectric of the selector 106 can be implemented with crystalline sulfides, such as chromium sulfide ($Cr_2S_3$) and iron sulfide (FeS), or a combination of any of such sulfides. In still other embodiments, the dielectric of the selector 106 can be implemented with a combination of such crystalline oxides, Perovskites, and sulfides. Numerous variations will be apparent. Note that such crystalline materials with S-shaped I-V characteristic are distinct from ovonic threshold switching chalcogenide materials with S-shaped I-V characteristic which are amorphous, which may be used in still other embodiments. Each of these example materials generally exhibits a bi-directional S-shaped I-V characteristic or otherwise allows for a snap-back condition, as previously discussed, and can be used to implement a selector element in accordance with an embodiment of the present disclosure.

Example System

Figure 6:
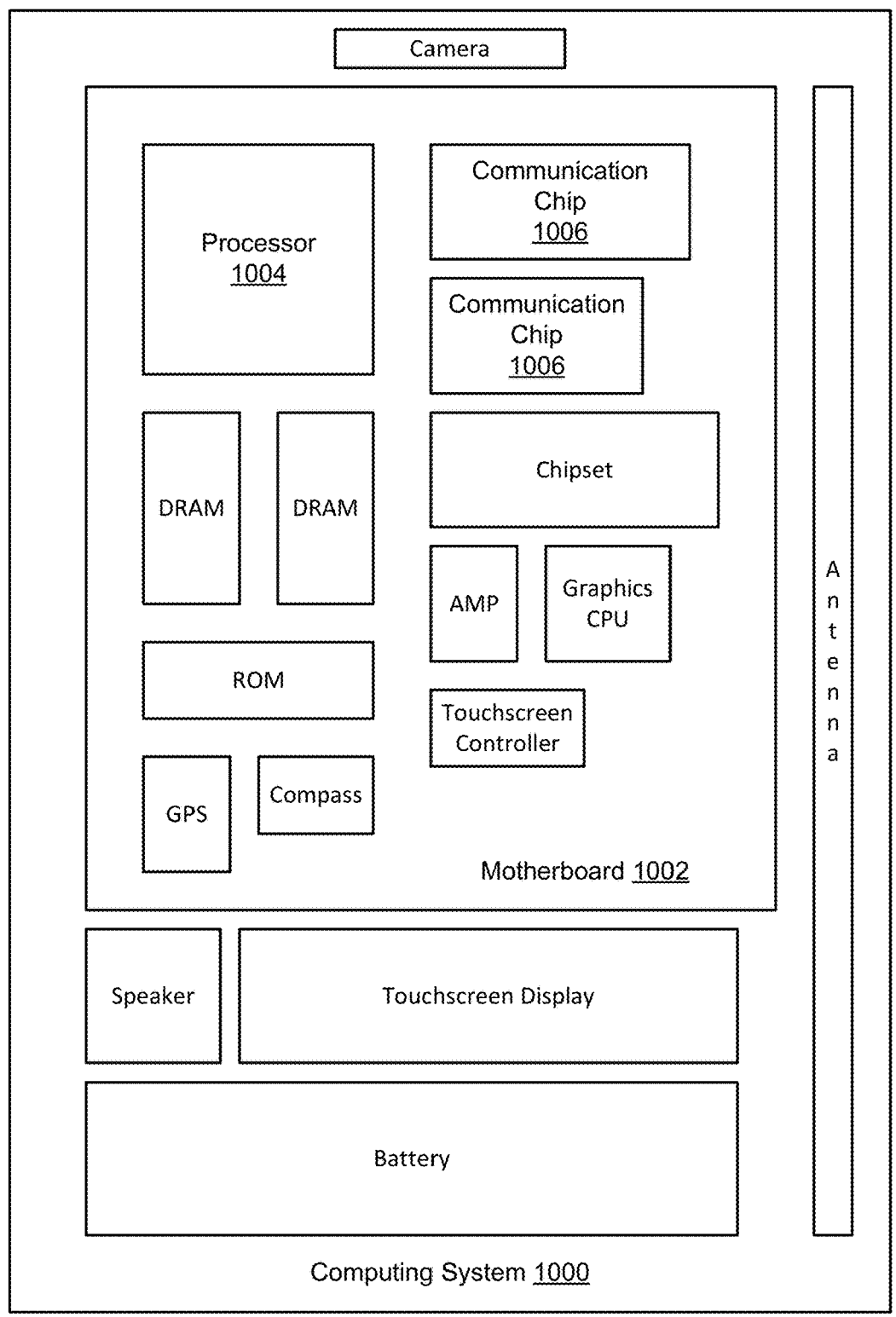
FIG. 6 illustrates a computing system implemented with integrated circuit structures or devices formed using the disclosed techniques in accordance with an example embodiment.

FIG. 6 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a non-volatile memory device including: a memory element; a selector element subjacent or superjacent the memory element; and a ballast resistor layer sandwiched between the memory element and the selector element.

Example 2 includes the subject matter of any of Examples 1 and 3-19, wherein the ballast resistor layer includes a sub-stoichiometric oxide of at least one of hafnium oxide ($HfO_x$), tantalum oxide ($TaO_x$), titanium oxide ($TiO_x$), and an alloy of any thereof.

Example 3 includes the subject matter of any of Examples 1-2 and 4-19, wherein the ballast resistor layer includes tantalum oxide ($TaO_x$), wherein x is in the range of about 1.2-2.1.

Example 4 includes the subject matter of any of Examples 1-3 and 5-19, wherein the ballast resistor layer includes tantalum oxide ($TaO_x$), wherein x is in the range of about 1.44-1.94.

Example 5 includes the subject matter of any of Examples 1-4 and 6-19, wherein the ballast resistor layer includes hafnium oxide (HfO$_x$), wherein x is in the range of about 0.3-0.8.

Example 6 includes the subject matter of any of Examples 1-5 and 7-19, wherein the ballast resistor layer has a thickness in the range of about 1-50 nm.

Example 7 includes the subject matter of any of Examples 1-6 and 8-19, wherein the ballast resistor layer is configured to dampen current surge related to a snapback characteristic of the selector element.

Example 8 includes the subject matter of any of Examples 1-7 and 9-19, wherein the ballast resistor layer has a first portion of a first thickness and a second portion of a second thickness different from the first portion.

Example 9 includes the subject matter of any of Examples 1-8 and 10-19, wherein the memory element includes an oxide of at least one of hafnium (Hf), tantalum (Ta), aluminum (Al), titanium (Ti), tungsten (W), nickel (Ni), and silicon (Si).

Example 10 includes the subject matter of any of Examples 1-9 and 11-19, wherein the memory element includes a resistive random-access memory element.

Example 11 includes the subject matter of any of Examples 1-10 and 12-19, wherein the memory element includes an oxide-based resistive random-access memory element.

Example 12 includes the subject matter of any of Examples 1-11 and 13-19, wherein the memory element includes a metal-based resistive random-access memory element.

Example 13 includes the subject matter of any of Examples 1-12 and 14-19, wherein the memory element includes a spin-transfer torque magnetic random-access memory element.

Example 14 includes the subject matter of any of Examples 1-13 and 15-19, wherein the selector element includes at least one of germanium telluride (GeTe$_6$), silicon telluride (SiTe$_6$), germanium selenide (Ge$_3$ Se$_2$), copper germanium selenide (Cu$_8$GeSe$_6$), copper indium selenide (CuInSe$_2$), copper indium telluride (CuInTe$_2$), and copper indium sulfide (CuInS$_2$).

Example 15 includes the subject matter of any of Examples 1-14 and 16-19, wherein the selector element includes a threshold selector.

Example 16 includes the subject matter of any of Examples 1-15 and 17-19 and further includes: a first electrode configured for electronic contact with the memory element; and a second electrode configured for electronic contact with the selector element; wherein at least one of the first and second electrodes includes at least one of copper (Cu), aluminum (Al), tungsten (W), nickel (Ni), cobalt (Co), silver (Ag), gold (Au), titanium (Ti), and tantalum (Ta).

Example 17 includes the subject matter of Example 16, wherein the first and second electrodes are arranged substantially orthogonal to one another.

Example 18 includes the subject matter of Example 16, wherein the first and second electrodes are arranged in a non-orthogonal alignment.

Example 19 includes the subject matter of any of Examples 1-18, wherein the memory device is configured as cross-point memory.

Example 20 is a non-volatile memory device including: a memory cell including: a threshold selector; a memory element; and a ballast resistor sandwiched between the threshold selector and the memory element; and first and second electrodes configured for electronic contact with the threshold selector and memory element, respectively.

Example 21 includes the subject matter of any of Examples 20 and 22-30, wherein the ballast resistor layer includes sub-stoichiometric hafnium oxide (HfO$_x$).

Example 22 includes the subject matter of any of Examples 20-21 and 23-30, wherein the ballast resistor layer includes sub-stoichiometric tantalum oxide (TaO$_x$).

Example 23 includes the subject matter of any of Examples 20-22 and 24-30, wherein the ballast resistor layer includes sub-stoichiometric titanium oxide (TiO$_x$).

Example 24 includes the subject matter of any of Examples 20-23 and 25-30, wherein the ballast resistor layer has a thickness in the range of about 1-50 nm.

Example 25 includes the subject matter of any of Examples 20-24 and 26-30, wherein the first and second electrodes are arranged substantially orthogonal to one another.

Example 26 includes the subject matter of any of Examples 20-25 and 27-30, wherein the selector element includes at least one of germanium telluride (GeTe$_6$), silicon telluride (SiTe$_6$), germanium selenide (Ge$_3$Se$_2$), copper germanium selenide (Cu$_8$GeSe$_6$), copper indium selenide (CuInSe$_2$), copper indium telluride (CuInTe$_2$), and copper indium sulfide (CuInS$_2$).

Example 27 includes the subject matter of any of Examples 20-26 and 28-30, wherein the memory element includes a resistive random-access memory element.

Example 28 includes the subject matter of any of Examples 20-27 and 29-30, wherein the memory element includes an oxide-based resistive random-access memory element.

Example 29 includes the subject matter of any of Examples 20-28 and 30, wherein the memory element includes a metal-based resistive random-access memory element.

Example 30 includes the subject matter of any of Examples 20-29, wherein the memory element includes a spin-transfer torque magnetic random-access memory element.

Example 31 is a cross-point non-volatile memory device including: a first plurality of memory cells, each memory cell including: either a resistive random-access memory (RRAM) element or a spin-transfer torque magnetic random-access memory (STTMRAM) element; a threshold selector disposed adjacent the RRAM element or STTMRAM element; and a ballast resistor layer disposed between the threshold selector and the RRAM element or STTMRAM element and including a sub-stoichiometric oxide of at least one of hafnium oxide (HfO$_x$), tantalum oxide (TaO$_x$), titanium dioxide (TiO$_x$), and an alloy of any thereof; and a first electrode layer including a first plurality of wires, each wire configured for electronic contact with a corresponding one of the RRAM elements or STTMRAM elements; and a second electrode layer including a second plurality of wires, each wire configured for electronic contact with a corresponding one of the threshold selectors.

Example 32 includes the subject matter of any of Examples 31 and 33-36, wherein the threshold selector includes at least one of germanium telluride (GeTe$_6$), silicon telluride (SiTe$_6$), germanium selenide (Ge$_3$ Se$_2$), copper germanium selenide (Cu$_8$GeSe$_6$), copper indium selenide (CuInSe$_2$), copper indium telluride (CuInTe$_2$), and copper indium sulfide (CuInS$_2$).

Example 33 includes the subject matter of any of Examples 31-32 and 34-36, wherein: the wires of the first electrode layer are arranged substantially parallel one another; the wires of the second electrode layer are arranged substantially parallel one another; and the wires of the first electrode layer are arranged substantially orthogonal to the wires of the second electrode layer.

Example 34 includes the subject matter of any of Examples 31-33 and 35-36, wherein the ballast resistor layer includes $TaO_x$, wherein x is in the range of about 1.2-2.1.

Example 35 includes the subject matter of any of Examples 31-34 and 36, wherein the ballast resistor layer includes $TaO_x$, wherein x is in the range of about 1.44-1.94.

Example 36 includes the subject matter of any of Examples 31-35, wherein the ballast resistor layer includes $HfO_x$, wherein x is in the range of about 0.3-0.8.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit including a non-volatile memory device comprising:
   a memory element;
   a selector element subjacent or superjacent the memory element; and
   a ballast resistor layer between the memory element and the selector element, wherein the ballast resistor layer comprises a sub-stoichiometric oxide of oxygen and at least one of hafnium and tantalum.

2. The integrated circuit of claim 1, wherein the sub-stoichiometric oxide comprises oxygen and either hafnium or tantalum but not both hafnium and tantalum.

3. The integrated circuit of claim 1, wherein the ballast resistor layer comprises tantalum oxide ($TaO_x$), wherein x is in the range of about 1.2-2.1.

4. The integrated circuit of claim 1, wherein the ballast resistor layer comprises tantalum oxide ($TaO_x$), wherein x is in the range of about 1.44-1.94.

5. The integrated circuit of claim 1, wherein the ballast resistor layer comprises hafnium oxide ($HfO_x$), wherein x is in the range of about 0.3-0.8.

6. The integrated circuit of claim 1, wherein the memory element comprises oxygen and at least one of hafnium (Hf), tantalum (Ta), aluminum (Al), titanium (Ti), tungsten (W), nickel (Ni), and silicon (Si).

7. The integrated circuit of claim 1, wherein the memory element comprises a resistive random-access memory element.

8. The integrated circuit of claim 1, wherein the memory element comprises an oxide-based resistive random-access memory element.

9. The integrated circuit of claim 1, wherein the memory element comprises a metal-based resistive random-access memory element.

10. The integrated circuit of claim 1, wherein the memory element comprises a spin-transfer torque magnetic random-access memory element.

11. The integrated circuit of claim 1, wherein the selector element comprises at least one of germanium telluride ($GeTe_6$), silicon telluride ($SiTe_6$), germanium selenide ($Ge_3Se_2$), copper germanium selenide ($Cu_8GeSe_6$), copper indium selenide ($CuInSe_2$), copper indium telluride ($CuInTe_2$), and copper indium sulfide ($CuInS_2$).

12. The integrated circuit of claim 1, wherein the memory device is configured as cross-point memory.

13. An integrated circuit including a non-volatile memory device comprising:
   a memory cell comprising:
      a threshold selector;
      a memory element; and
      a ballast resistor between the threshold selector and the memory element, wherein the ballast resistor comprises a sub-stoichiometric oxide of oxygen and at least one of hafnium and tantalum; and
   first and second electrodes configured for electronic contact with the threshold selector and memory element, respectively.

14. The integrated circuit of claim 13, wherein the sub-stoichiometric oxide comprises at least one of hafnium oxide ($HfO_x$), and tantalum oxide ($TaO_x$).

15. The integrated circuit of claim 13, wherein the threshold selector comprises at least one of germanium telluride ($GeTe_6$), silicon telluride ($SiTe_6$), germanium selenide ($Ge_3Se_2$), copper germanium selenide ($Cu_8GeSe_6$), copper indium selenide ($CuInSe_2$), copper indium telluride ($CuInTe_2$), and copper indium sulfide ($CuInS_2$).

16. An integrated circuit including a cross-point non-volatile memory device comprising:
   a first plurality of memory cells, each memory cell comprising:
      either a resistive random-access memory (RRAM) element or a spin-transfer torque magnetic random-access memory (STTMRAM) element;
      a threshold selector adjacent the RRAM element or STTMRAM element; and
      a ballast resistor layer between the threshold selector and the RRAM element or STTMRAM element and comprising a sub-stoichiometric oxide of at least one of hafnium oxide ($HfO_x$), tantalum oxide ($TaO_x$), and an alloy of any thereof; and
   a first electrode layer comprising a first plurality of wires, each wire configured for electronic contact with a corresponding one of the RRAM elements or STTMRAM elements; and
   a second electrode layer comprising a second plurality of wires, each wire configured for electronic contact with a corresponding one of the threshold selectors.

17. The integrated circuit of claim 16, wherein the threshold selector comprises at least one of germanium telluride ($GeTe_6$), silicon telluride ($SiTe_6$), germanium selenide ($Ge_3Se_2$), copper germanium selenide ($Cu_8GeSe_6$), copper indium selenide ($CuInSe_2$), copper indium telluride ($CuInTe_2$), and copper indium sulfide ($CuInS_2$).

18. The integrated circuit of claim 16, wherein the ballast resistor layer comprises $TaO_x$, wherein x is in the range of about 1.2-2.1.

19. The integrated circuit of claim 16, wherein the ballast resistor layer comprises $TaO_x$, wherein x is in the range of about 1.44-1.94.

20. The integrated circuit of claim 16, wherein the ballast resistor layer comprises $HfO_x$, wherein x is in the range of about 0.3-0.8.

* * * * *